(12) United States Patent
Nagashima et al.

(10) Patent No.: US 6,657,526 B2
(45) Date of Patent: Dec. 2, 2003

(54) POWER LEAD FOR SUPERCONDUCTIVE MAGNET

(75) Inventors: Ken Nagashima, Tokyo (JP); Masaru Tomita, Tokyo (JP); Kaoru Nemoto, Kokubunji (JP); Toshiki Herai, Kokubunji (JP); Masato Murakami, Tokyo (JP)

(73) Assignees: International Superconductivity Technology Center, Tokyo (JP); Railway Technical Research Institute, Tokyo (JP)

( * ) Notice: Subject to any disclaimer, the term of this patent is extended or adjusted under 35 U.S.C. 154(b) by 0 days.

(21) Appl. No.: 10/028,993

(22) Filed: Dec. 21, 2001

(65) Prior Publication Data

US 2002/0132738 A1 Sep. 19, 2002

(30) Foreign Application Priority Data

Dec. 26, 2000 (JP) ........................................ 2000-404695

(51) Int. Cl.[7] ................................................ H01F 6/00
(52) U.S. Cl. ........................ 335/216; 505/220; 505/230; 505/706; 505/879
(58) Field of Search .......................... 335/216; 324/318, 324/319, 320; 174/15.4, 15.5, 125.1; 505/211, 220, 230, 704, 705, 706, 879, 880, 884, 887; 62/51.1; 104/281–286

(56) References Cited

U.S. PATENT DOCUMENTS

| | | | | |
|---|---|---|---|---|
| 5,235,309 A | * | 8/1993 | Preisler et al. | 505/210 |
| 5,623,240 A | * | 4/1997 | Sakuraba et al. | 335/216 |
| 5,742,217 A | * | 4/1998 | Bent et al. | 335/216 |
| 6,413,624 B1 | * | 7/2002 | Tomita et al. | 428/306.6 |

OTHER PUBLICATIONS

Masaru Tomita, et al., "Resin–Impregnated RE–Ba–Cu–O Current Leads for Maglev", 6 pages (Jul. 2000).

* cited by examiner

*Primary Examiner*—Ramon M. Barrera
(74) *Attorney, Agent, or Firm*—Flynn, Thiel, Boutell & Tanis, P.C.

(57) ABSTRACT

There is provided a power lead for a superconductive magnet capable of controlling the invasion of heat to liquid helium for storing superconductive coils therein and of sufficiently feeding power to the superconductive coils. The power lead for a superconductive magnet of a superconductor magneto unit for supplying a current to the superconductive coils which are cooled at a liquid helium temperature through a radiant heat shielded section which is cooled at a liquid nitrogen temperature, wherein at least a part of sections positioned inside the radiant heat shielded section of a current lead member of the superconductive magnet comprises a high temperature oxide superconductor bulk body having a critical temperature exceeding a liquid nitrogen temperature. In this case, it is preferable to apply a resin impregnation treatment to the bulk body to enforce the high temperature oxide superconductor bulk body section. If at least a part of sections other than the bulk body is formed of a braided wire, a stress caused by the relative displacement between constituents of the unit does not influence upon the bulk body, thereby reducing the risk of breakage of the unit.

12 Claims, 2 Drawing Sheets

POWER LEAD FOR SUPERCONDUCTIVE MAGNET

BACKGROUND OF THE INVENTION

1. Field of the Invention

The invention relates to a power lead for a superconductive magnet to supply a current to superconductive coils of the superconductive magnet to be mounted on a vehicle of a levitated train, and for use in, e.g. an energy storage unit, a power generator, a medical equipment.

2. Description of the Related Art

The most widely used means at present for supplying a current to superconductive coils of a superconductive magneto unit comprises disposing a power source in a room temperature section of the superconductive magneto unit and supplying a current from the power source to the superconductive coils which are placed on a cryogenic section using a lead wire (hereinafter referred to as a power lead) made of copper.

However, according to the method of supplying a current using the power lead made of copper, heat loss (deterioration of cooling efficiency) caused by the employment of the power lead cannot be ignored.

The heat loss caused by the employment of the power lead comprises a loss caused by Joule heat produced by electric resistance of the power lead and another loss caused by heat which inflows through the power lead due to thermal conduction, and it occupies most of the total heat loss in a superconductive magneto unit.

If a sectional area of the power lead is rendered large, Joule heat becomes small. However, in that case, heat inflowing from the outside becomes large. On the contrary, if the sectional area of the power lead is rendered small, the heat inflowing from the outside becomes small, but Joule heat becomes large.

Accordingly, the sectional area of the power lead is set at a proper value by which the foregoing two heat losses are balanced.

Meanwhile, in a normal superconductive magneto unit, the cryogenic section in which superconductive coils are placed is cooled by liquid helium supplied thereto wherein the unit is operated as liquid helium is supplied to the cryogenic section and a helium gas which is evaporated at the cryogenic section is collected. However, since the helium gas immediately after evaporated is at a cryogenic temperature of 4.2 K, the power lead is cooled by the collected evaporated helium gas, thereby reducing the heat loss at the cryogenic section.

There is employed a power supply member (it is also referred to as a gas cooling lead wire) having a structure to seal a power lead inside a gas transfer tube through which evaporated helium gas is collected so as to cool the power lead by the foregoing evaporated helium gas.

For example, FIG. 2 is a schematic view showing a main portion of a superconductive magneto unit for a vehicle which is used by a testing vehicle of a levitated train, and comprises baths 3, 3 that are cooled at a cryogenic temperature i.e. at the temperature of liquid helium (4.2 K) (hereinafter referred to as liquid helium temperature) and disposed inside a radiant heat shielded section (radiant heat shielded system), which is kept at a liquid nitrogen temperature (77.3 K) while shielded by a radiant heat shielded plate 2 provided for preventing invasion of heat from the outside of an outer bath 1, superconductive coils 4, 4 which are sealed and installed inside the inner baths 3, 3, and an external power source by a gas cooling lead wire (a power lead 5 made of copper is sealed by a coolant gas transfer tube 6) for connecting between an external power source and the superconductive coils 4, 4.

In FIG. 2, depicted by 7 is permanent current switches (which are cooled at a liquid helium temperature) wherein terminals of the superconductive coils are short circuited in a superconducting state or manner when a current supplied thereto reaches a given value so that a permanent current flows inside the superconductive coils 4, 4.

Depicted by 8 is a thermal anchor (which is formed of a metal block having high thermal conductivity such as pure copper and is cooled at a liquid nitrogen temperature) serves to prevent a heat from invading from the outside to a cryogenic section through the power lead 5.

However, even if the power lead has the foregoing gas cooled structure, the length of the power lead has to be rendered as long as possible so that the invasion of heat can be sufficiently prevented and heat can be escaped while contacting the coolant gas because the power lead member made of copper is very excellent in thermal conductivity as well as electric conductivity (in the unit shown in FIG. 2, the power lead is rendered long to the extent of 1 m and is accommodated in a U shape). As a result, it is difficult to render the unit small sized, and the generation of Joule heat increases when the power lead is rendered long so that the heat loss reduction effect fell short of an intended value.

Further, the power lead having the gas cooled structure has to be used in the manner that it is cooled by evaporated helium gas when turning on an electricity so that the generation of Joule heat increases, causing a problem that an electricity cannot be turned on for a long period of time.

SUMMARY OF THE INVENTION

Therefore, it is an object of the invention to provide a power lead for use in superconductive magnet capable of effectively controlling the invasion of heat to a liquid helium system (inner baths and permanent current switches) without influencing upon the miniaturization or simplification of a superconductive magneto unit, but supplying a current for a long period of time while securing current-carrying capacity.

Accordingly, inventors of this application endeavored themselves to achieve the foregoing object and obtained the following finding.

That is, although high temperature oxide superconductors each having a critical temperature which exceeds a liquid nitrogen temperature have been sequentially discovered and techniques for make up a bulk body thereof having a high critical current density have been remarkably developed, the high temperature oxide superconductor bulk body is very low in thermal conductivity compared with a metal material such as copper which has been so far applied to the power lead member for a superconductive magnet. Accordingly, if at least a part of "a section positioned inside a radiant heat shielded section" of a power lead member of a superconductive magnet for supplying a current to "superconductive coils which are cooled at a liquid helium temperature" through "the radiant heat shielded section which is cooled to the liquid nitrogen temperature" is replaced by such a high temperature oxide superconductor bulk body having a low thermal conductivity but high critical current density, the high temperature oxide superconductor bulk body having a low thermal conductivity becomes the obstruction to the heat transfer so that invasion of heat from the radiant heat shielded section to the permanent current switches or inner baths (inner bath system) through the power lead member can be remarkably reduced.

That is, since the high temperature oxide superconductor bulk body section becomes an obstacle for preventing invasion of heat from the radiant heat shielded section to the permanent current switches or inner baths, even if the lead member extending to the high temperature oxide superconductor bulk body is formed of a copper wire having a large sectional area through which heat inflows becomes large, the heat inflowing to the permanent current switches and the inner baths can be effectively prevented by the high temperature oxide superconductor bulk body section, and also a large current can be supplied to the power lead member under the condition where Joule heat generates less by the use of the power lead member having a large sectional area.

It is a matter of course that since the high temperature oxide superconductor bulk body section per se is kept up at a temperature under a transition temperature (liquid nitrogen temperature), electric resistance becomes 0, so that a large current can be supplied to the power lead member without loss, i.e. without generation of heat.

Further, when the high temperature oxide superconductor bulk body section is made up in the shape of a meander, heat insulation distance by the high temperature oxide superconductor bulk body section can be extended so as to more reduce the invasion of heat through the high temperature oxide superconductor bulk body section.

Although the high temperature oxide superconductor bulk body is a material which is not so strong in mechanical strength and easily broken, if a resin impregnation treatment is applied to this material, its strength can be remarkably improved without deteriorating characteristics for the superconductor bulk body, thereby securing a performance sufficiently satisfying a power lead member of the superconductive magnet to be mounted on a vehicle.

Further, with the superdconductive magnet of a magnetic levitated train or the like, it is anticipated that a relative displacement occurred between the inner baths and radiant heat shielded section when the magnetic levitated train runs, and hence a stress caused by such a relative displacement is applied to the power lead extended between the inner baths and radiant heat shielded section, so that there is fear that the high temperature oxide superconductor bulk body section which is relatively weak in a mechanical strength is broken. However, even in such a case, at least a part of the sections other than the high temperature oxide superconductor bulk body section has a construction to which a braid wire is connected, such fear can be dissolved.

The invention has been accomplished based on the foregoing findings, and it is an object of the invention to provide a power lead for a superconductive magnet which is set forth hereunder as the first to fifth aspects of the invention.

(1) The combination of power lead and a superconductor magneto unit according to the first aspect of the invention includes the power lead supplying current to superconductive coils which are cooled at a liquid helium temperature, radiant heat shielded section receiving the power lead that is cooled at a liquid nitrogen temperature, wherein at least a portion of the power lead positioned inside the radiant heat shielded section comprising a high temperature oxide superconductor bulk body having a critcal temperature exceeding the liquid nitrogen temperature wherein the high temperature oxide superconductor bulk body of the power lead of the first aspect of the invention is in the shape of a member.

(2) The combination according to the second aspect of the invention is characterized in that the high temperature oxide superconductor bulk body of the power lead of the first of second aspect of the invention comprises a high temperature oxide superconductor bulk body impregnated with resin under vacuum.

(3) The combination according to the third aspect of the invention is characterized in that the high temperature oxide superconductor bulk body of the power lead of the first or second aspect of the invention is formed by connecting electric conductor blocks to both ends of a high temperature oxide superconductor bulk body section to form an integrated body and applying a resin impregnation treatment to the integrated body.

(4) The combination according to the fourth aspect of the invention is characterized in that the power lead comprises a flexible braided wire connected to the high temperature oxide superconductor bulk body of any of the first to third aspects of the invention.

For a high temperature oxide superconductor bulk body applied to the power lead for a superconductive magnet of the invention is not limited to its kind if a critical temperature is higher than a liquid nitrogen temperature, for example, it may employ a sintered body of copper oxide superconductor or (represented by chemical formula: $YBa_2Cu_3O_y$, $LaBa_2Cu_3O_y$, $NdBa_2Cu_3O_y$, $SmBa_2Cu_3O_y$, $EuBa_2Cu_3O_y$, $GdBa_2Cu_3O_y$, $ErBa_2Cu_3O_y$, $LuBa_2Cu_3O_y$, $Tl_2Ba_2Ca_2Cu_3O_y$, and the like) including e.g. of rare-earth element (not less than one kind of Y, La, Nd, Sm Eu, Gd, Dy, Ho, Er, Tm Yb) or bulk body thereof obtained by a melt process. It is preferable that the high temperature oxide superconductor bulk body is obtained by the melt process in view of the strength and the superconductor characteristics.

Further, according to the invention, the high temperature oxide superconductor bulk body section of the power lead is "enforced when it is impregnated with resin", particularly, if the bulk body is made up in the shape of a meander, the stress localized spots increase so that the enforcement of the bulk body by the application of a resin impregnation treatment is practically very effective means.

Further, when the high temperature oxide superconductive bulk body section is made up in the shape of a meander, heat insulation distance by the high temperature oxide superconductor bulk body section can be extended so as to reduce more the invasion of heat through the high temperature oxide superconductor bulk body section.

For means to impregnate the high temperature oxide superconductor bulk body with resin, a method of allowing the high temperature oxide superconductor bulk body held in the pressure reduction atmosphere such as vacuum to contact a liquefied resin is very effective.

In order to enforce the high temperature oxide superconductor bulk body by the resin impregnation treatment, it is better that the high temperature oxide superconductor bulk body held in a pressure reduction atmosphere such as vacuum is brought into contact with a liquefied resin. As a result, the resin percolates through the surface layer section of the high temperature oxide superconductor bulk body, thereby remarkably improve a mechanical strength of the high temperature oxide superconductor bulk body without exerting an adverse influence on the superconductor characteristics. In this case, there is no problem even if the surface of the high temperature oxide superconductor bulk body impregnated with resin is covered with a resin layer.

Meanwhile, although it is considered that the surface layer of the high temperature oxide superconductor bulk body is not impregnated with resin in the case of high temperature oxide superconductor bulk body obtained by the melt process, because of monocrystal or seudomonocrystal ceramic, it is difficult practically to prevent the generation of microcracks or air holes in high temperature oxide superconductor bulk body during the step of making up the bulk body. However, if a resin impregnation treatment is applied to the high temperature oxide superconductor bulk body, not only the minute cracks opened on the upper surface but also the entire surface layer section are impregnated with resin, and further the interior of the bulk body is also impregnated with resin, thereby preventing the occurrence of localization of stress in the cracks or air holes so that the mechanical strength of the bulk body per se can be remarkably improved.

For a resin with which the high temperature oxide superconductor bulk body is impregnated under vacuum, it is preferable to employ thermosetting resins such as an epoxy resin, a urea resin, a phenol resin, an unsaturated polyester resin, a polyurethane resin, an alkyd resin, a melamine resin, and the like.

It is preferable means to add a filler (e.g. quarts, calcium carbonate, alumina, glass, talc, etc.) to the resin with which the bulk body is impregnated under vacuum for enforcing the high temperature oxide superconductor bulk body so as to approach the coefficient of linear expansion of the high temperature oxide superconductor bulk body while reducing the coefficient of the linear expansion of the resin.

Further, it is also preferable that the high temperature oxide superconductor bulk body is wrapped with a cloth (glass fiber, carbon fiber, ceramic fiber, polyamide high polymer fiber, etc.) to form an integrated body, which is then impregnated with resin under vacuum so that the bulk body formed by impregnating the high temperature oxide superconductor bulk body section of the power lead with resin by a resin impregnation treatment and the cloth which is impregnated with resin and wraps the bulk body are integrated with each other. As a result, the strength of the high temperature oxide superconductor bulk body section is more improved.

An example of means for impregnating the high temperature oxide superconductor bulk body with resin under vacuum is as follows.

Firstly, a YBCO($YBa_2Cu_3O_y$) oxide superconductor bulk body impregnated with resin manufactured by a melt process is put into a vacuum tube, and the vacuum vessel is preheated at a temperature up to 70° C., then it is reduced in pressure, subsequently a bisphenol A type epoxy resin and aromatic polyamine are mixed with each other in a state where they are respectively preheated at a temperature up to 30° C. with a composition of (wt %) 100: 32 and deaerated under vacuum to prepare the mixture which is injected into the bulk body to cover the bulk body so as to impregnate the bulk body with resin, and then they are placed in the atmosphere, thereafter heated at 80° C. for 6 hours to cure the resin. As a result, "the high temperature oxide superconductor bulk is impregnated with resin under vacuum" can be obtained.

In order to make up the power lead for a superconductive magnet comprising "the high temperature oxide superconductor bulk body is impregnated with resin under pressure", electric conductor blocks such as copper blocks are first connected to both ends of the high temperature oxide superconductor bulk body as electric contact terminals, then it is recommended that this integrated body is impregnated with resin by a resin impregnation treatment as a whole. The reason is that a layer impregnated with resin is formed on the surface layer of the high temperature oxide superconductor bulk body by this treatment to enforce the bulk body so that the integrated body formed by the bulk body and the electric conductor blocks is rendered in a state to be covered with a resin film having no air bubbles, thereby achieving the protection and reinforcement of the contacts between the high temperature oxide superconductor bulk body and the electric conductor blocks, resulting in the improvement of the power supply characteristics and durability of the power lead. Meanwhile, when other lead members are connected to the portion of the electric conductor blocks which are covered with a resin film, the resin film at the connected portion is removed or it is enough to apply a masking to the connected portion not to be covered with the resin film before the application of the resin impregnation treatment.

PREFERRED EMBODIMENT OF THE INVENTION

Figure 1:
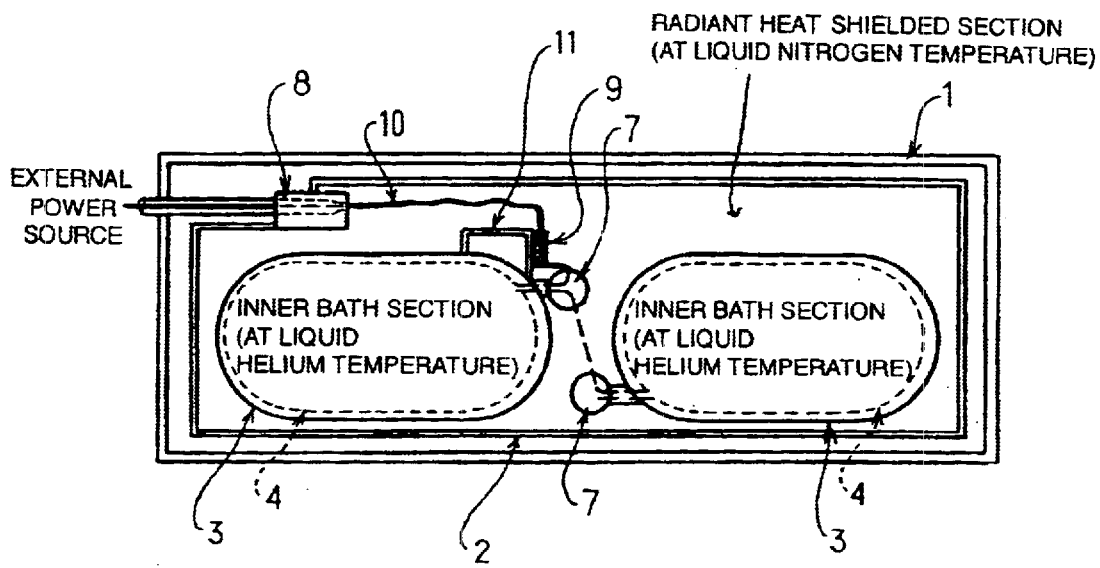
FIG. 1 is a schematic view of a power lead for a superconductive magnet according to a preferred embodiment of the invention.
Figure 2:
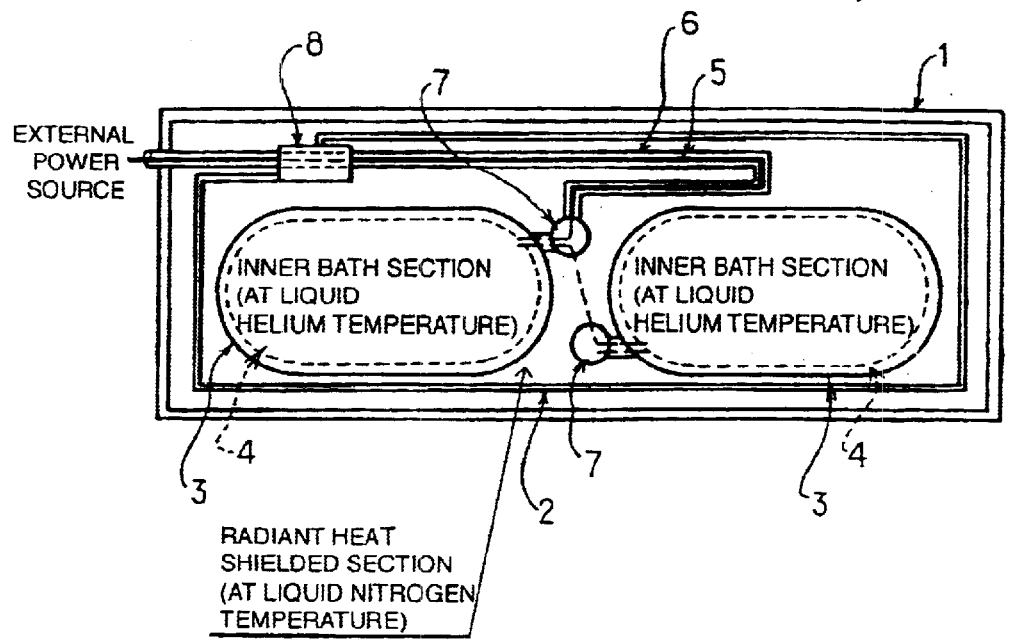
FIG. 2 is a view for explaining a conventional power lead for superconductive magnet.

FIG. 1 is a schematic view of a power lead for a superconductive magnet according to a preferred embodiment of the invention.

Figure 3:
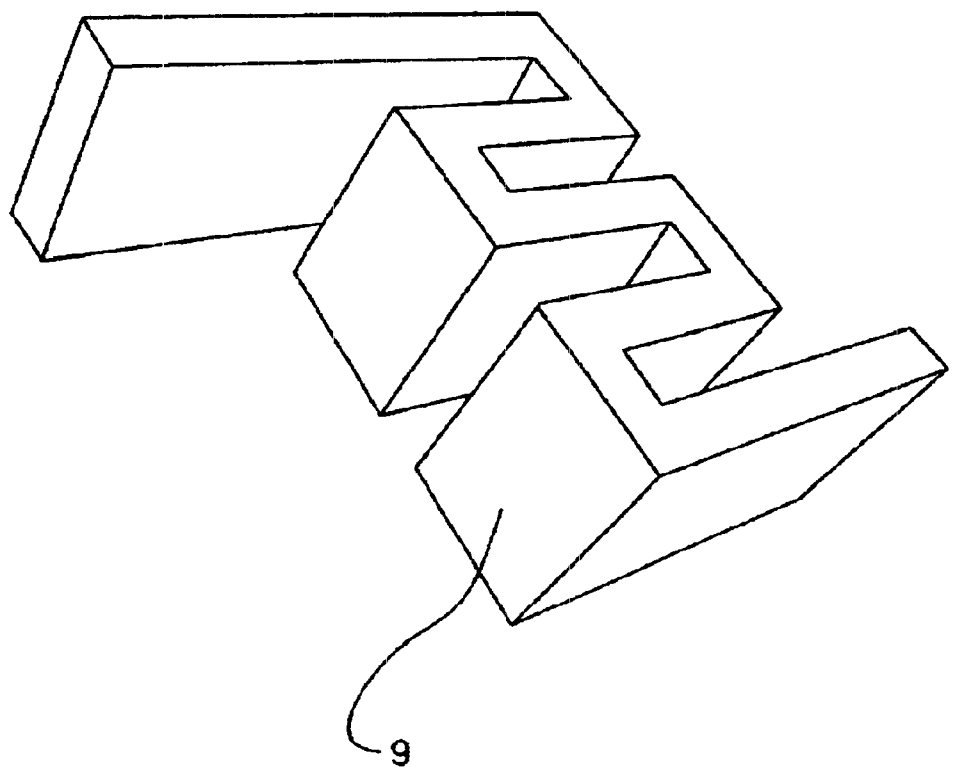
FIG. 3 is a view of a meander type bulk body.

A power lead of the invention comprises mainly high temperature oxide superconductor bulk bodies 9 each positioned at the side of the inner bath sections, e.g. a monocrystal YBCO($YBa_2C_u3O_y$) bulk body which has a meander shape as shown in FIG. 3, and a braided wire connected in series to the high temperature oxide superconductor bulk body.

It is preferable that the high temperature oxide superconductive bulk body is formed, e.g. by coating the both ends of the bulk body with a silver film by a sputtering process, soldering the both ends coated with the silver film by a copper block, and impregnating it with an epoxy resin and the like under vacuum. It is preferable at this time that the other end of the copper block is masked off without being covered with a resin.

The power lead of the invention is used in such a manner that the section of the high temperature oxide superconductor bulk body 9 is rigidly fixed to the inner bath 3 by a superconductor bulk body fixing member 11 and the like. The section of the high temperature oxide superconductor bulk body 9 may be fixed by a radiant heat shielded plate 2.

Although a current is supplied from an external power source to superconductive coils 4, 4 through the braided wire 10 of the power lead and the high temperature oxide superconductor bulk body 9 when the superconductive magneto unit is operated, most of the invaded heat from the outside which is not blocked by a thermal anchor 8 reaches the high temperature oxide superconductor bulk body 9 through the braided wire 10 having an excellent thermal conductivity. Since the high temperature oxide superconductor bulk body 9 is low in thermal conductivity and high in heat insulation, the invaded heat stops at that section so that it is dissipated at the radiant heat shielded section before it is transferred to the permanent current switch 7 or the inner baths 3, thereby restraining the invaded heat from invading the permanent current switch 7 and the inner baths 3. Accordingly, the heat loss of the superconductive magneto unit becomes extremely small.

Since the high temperature oxide superconductor bulk body 9 which is positioned at the radiant heat shielded section is cooled at a liquid nitrogen temperature, it is kept in a superconducting state and the high temperature oxide superconductor bulk body 9 per se does not generate heat so that a large current can be supplied without loss, whereby feeding of power to the superconductive coils 4, 4 is not obstructed.

Although it has been described that the relative displacement between the inner baths and the radiant heat shielded section is prone to occur when the vehicle which mounts thereon the superconductive magnet runs, such a displacement is absorbed by the flexible braided wire 10, thereby preventing the high temperature oxide superconductor bulk body 9 which is relatively weak in mechanical stress caused by the displacement from being broken.

As mentioned in detail above, according to the invention, it is possible to provide the power lead for a superconductive magnet capable of feeding power for a long period of time while securing a large current-carrying capacity and restraining the amount of heat to be invaded to a liquid helium to a large extent compared with the conventional power lead. Further, since a gas cooling circuit of a power lead which is indispensable for the conventional power lead can be omitted, the superconductive magneto unit can be made small to a large extent and also the control for operating a cooling system can be simplified. Accordingly, the invention can be significantly attributable to an industrial application.

What is claimed is:

1. A combination of a power lead and a superconductor magneto unit having a superconductive magnet, the power lead supplying a current to superconductive coils which are cooled at a liquid helium temperature, a radiant heat shielded section receiving the power lead that is cooled at a liquid nitrogen temperature, at least a portion of the power lead positioned inside the radiant heat shielded section comprising a high temperature oxide superconductor bulk body having a critical temperature exceeding the liquid nitrogen temperature wherein the high temperature oxide superconductor bulk body of the power lead is in the shape of a meander.

2. The combination according to claim 1, wherein the high temperature oxide superconductor bulk body of the power lead comprises a high temperature oxide superconductor bulk body impregnated with resin under vacuum.

3. The combination according to claim 1, wherein the high temperature oxide superconductor bulk body of the power lead is formed by connecting electric conductor blocks to both ends of a high temperature oxide superconductor bulk body section to form an integrated body and applying a resin impregnation treatment to the integrated body.

4. The combination according to claim 1, wherein of the power lead comprises a flexible braided wire connected to the high temperature oxide superconductor bulk body.

5. A superconductor magneto unit, comprising:

an outer bath;

a radiant heat shield defining a radiant heat shielded section within the outer bath to prevent invasion of heat from outside the outer bath;

at least one inner bath defining an inner bath section located within the outer bath and within the radiant heat shield;

at least one sealed superconductive coil located within the inner bath section;

a power lead comprising a high temperature oxide superconductor bulk body positioned adjacent the inner bath section, the power lead further comprising a flexible wire connected to the high temperature oxide superconductor bulk body; and a permanent current switch connected to the high temperature oxide superconductor bulk body for transferring current to the at least one sealed super-conductive coil, the high temperature oxide superconductor bulk body dissipating heat before the heat transfers to the inner bath section, wherein the radiant heat shielded section is cooled at a liquid nitrogen temperature and the inner bath section is cooled at a liquid helium temperature so that feeding of power to the superconductive coil can be supplied without loss, and wherein the flexible wire absorbs displacement between the inner bath and the radiant heat shield during supply of power to the superconductive coil to prevent mechanical stress on the high temperature oxide superconductor bulk body.

6. Superconductor magneto unit of claim 5, comprising a superconductor bulk body-securing member for rigidly securing the high temperature oxide superconductor bulk body to the inner bath.

7. The superconductor magneto unit of claim 5, wherein the combination is free from a gas cooling circuit for a power lead.

8. The superconductor magneto unit of claim 5, wherein the flexible wire comprises a braided wire.

9. The superconductor magneto unit of claim 5, comprising a thermal anchor connected to the power lead and for blocking heat from invading the radiant heat shielded section and for connection to an external power source.

10. The superconductor magneto unit of claim 5, wherein the high temperature oxide superconductor bulk body of the power lead is in the shape of a meander.

11. A power lead for a superconductor magneto unit having an outer bath, a radiant heat shield defining a radiant heat shielded section, an inner bath defining an inner bath section located within the outer bath and within the radiant heat shield and at least one sealed superconductive coil within the inner bath section, a thermal anchor for blocking heat from invading the radiant heat shielded section, and a permanent current switch for transferring current to the at least one sealed super-conductive coil, the power lead comprising a high temperature oxide superconductor bulk body for positioning adjacent the inner bath section, the power lead further comprising a flexible braided wire connected at one end to a first portion of the high temperature oxide superconductor bulk body and for connection at the other end to the thermal anchor, the high temperature oxide superconductor bulk body including a second portion for connection to the permanent current switch;

wherein the high temperature oxide superconductor bulk body is capable of dissipating heat for preventing heat transfer therethrough to the permanent current switch and the superconductive coil, and wherein the flexible wire is capable of absorbing displacement between the radiant heat shield and the high temperature oxide superconductor bulk body during operation of the superconductive magnet for preventing mechanical stress on the high temperature oxide superconductor bulk body.

12. The power lead of claim 11, wherein the flexible braided wire is free from an individual gas cooling circuit extending thereabout.

* * * * *